United States Patent
Liu et al.

(10) Patent No.: US 7,597,979 B2
(45) Date of Patent: *Oct. 6, 2009

(54) STRUCTURE OF INTEGRATED PACKED FUEL CELL

(75) Inventors: Yung-Yi Liu, Taipei Hsien (TW); Shing-Fun Ho, Taipei (TW); James Shang, Taoyuan (TW); Yi-Chen Chen, Taoyuan County (TW)

(73) Assignee: Nan Ya Printed Circuit Board Corporation, Luchu, Taoyuan (TW)

( * ) Notice: Subject to any disclaimer, the term of this patent is extended or adjusted under 35 U.S.C. 154(b) by 961 days.

This patent is subject to a terminal disclaimer.

(21) Appl. No.: 11/160,207

(22) Filed: Jun. 14, 2005

(65) Prior Publication Data
US 2006/0121328 A1 Jun. 8, 2006

(30) Foreign Application Priority Data
Dec. 8, 2004 (TW) .............................. 93138042 A

(51) Int. Cl.
H01M 8/10 (2006.01)
H01M 2/08 (2006.01)

(52) U.S. Cl. ......................................... 429/32; 429/36
(58) Field of Classification Search .................. 429/22, 429/30, 34, 32, 36
See application file for complete search history.

(56) References Cited

U.S. PATENT DOCUMENTS

| 6,214,487 | B1 * | 4/2001 | Kelley et al. | 429/23 |
| 7,220,507 | B2 * | 5/2007 | Liu et al. | 429/32 |
| 2004/0091758 | A1 * | 5/2004 | Kuriyama et al. | 429/22 |

* cited by examiner

Primary Examiner—Patrick Ryan
Assistant Examiner—Julian Mercado
(74) Attorney, Agent, or Firm—Winston Hsu

(57) ABSTRACT

A structure of an integrated packed fuel cell including an integrated cathode electrode sheet that further includes a substrate, at least a cathode electrode area, and at least a conductive opening, an intermediate bonding layer that further includes at least a bonding sheet and at least a conductive opening, an integrated anode electrode sheet that further includes a substrate, at least an anode electrode area, at least a conductive pad, a device combination, and a fuel container base.

14 Claims, 13 Drawing Sheets

STRUCTURE OF INTEGRATED PACKED FUEL CELL

BACKGROUND OF THE INVENTION

1. Field of the Invention

The present invention relates to a fuel cell, and more particularly, to an integrated packed fuel cell.

2. Description of the Prior Art

A fuel cell is an electrochemical cell in which a free energy change resulting from a fuel oxidation reaction is converted into electrical energy. Fuel cells utilizing methanol as fuel are typically called Direct Methanol Fuel Cells (DMFCs). These DMFC's generate electricity by combining gaseous or aqueous methanol with air. DMFC technology has become widely accepted as a viable fuel cell technology that lends itself to many application fields such as: electronic apparatuses, vehicles, military equipment, the aerospace industry, and so on.

DMFCs, like ordinary batteries, provide DC electricity from two electrochemical reactions. These reactions occur at electrodes (or poles) to which reactants are continuously fed. The negative electrode (anode) is maintained by supplying methanol, whereas the positive electrode (cathode) is maintained by the supply of air. When providing current, methanol is electrochemically oxidized at the anode electrocatalyst to produce electrons, which travel through the external circuit to the cathode electrocatalyst where they are consumed together with oxygen in a reduction reaction. The circuit is maintained within the cell by the conduction of protons in the electrolyte. One molecule of methanol ($CH_3OH$) and one molecule of water ($H_2O$) together store six atoms of hydrogen. When fed as a mixture into a DMFC, they react to generate one molecule of $CO_2$, 6 protons ($H+$), and 6 electrons to generate a flow of electric current. The protons and electrons generated by methanol and water react with oxygen to generate water.

In the past, when a conventional fuel cell is applied in portable electronic products such as notebook computers, PDAs, or camcorders, a control box containing circuit boards and various active or passive devices including control chips, resistors, inductors, capacitors or semiconductor chip is often needed to monitor and distribute the fuel content, concentration, current, and voltage of the fuel cell. Please refer to FIG. 1. FIG. 1 is a perspective diagram showing the energy management system 2 of a conventional fuel cell. As shown in FIG. 1, the energy management system 2 of the conventional fuel cell includes a control box 4 and a display 6, in which the control box 4 is connected to a fuel cell 8 and to a notebook computer 10. Obviously, the control box 4 will often cause extra burden when the entire setup is carried or otherwise relocated. Additionally, the required need for the control box 4 increases the overall fabrication cost.

SUMMARY OF THE INVENTION

It is therefore an objective of the present invention to provide an integrated packed fuel cell to solve the above-mentioned problems.

According to the present invention, an integrated cathode electrode sheet includes a substrate, a patterned copper layer forming at least a cathode electrode area on both sides of the substrate, and at least a conductive via through hole, in which a plurality of openings are formed within the cathode electrode area and the conductive via through hole is located outside the cathode electrode area and connected to the cathode electrode area via a conductive wire. Next, an intermediate bonding layer is provided, in which the intermediate bonding layer is comprised of at least one bonding sheet. Additionally, the intermediate bonding layer further comprises at least one opening within each bonding sheet for containing a proton exchange membrane. The intermediate bonding layer further includes at least a conductive via through hole, in which the conductive via through hole is disposed and corresponds to the conductive via through hole of the integrated cathode electrode sheet.

Next, an integrated anode electrode sheet includes a substrate, a patterned copper layer forming at least an anode electrode area on both sides of the substrate, in which the anode electrode area is located and corresponds to the cathode electrode area, and at least a conductive pad located and corresponds to the conductive via through hole of the integrated cathode electrode sheet, in which the conductive pad is located outside the anode electrode area and connected to the anode electrode are via a conductive wire.

Next, a device combination is embedded over the surface of the integrated anode electrode sheet. Preferably, the device combination is comprised of electronic devices such as capacitors, resistors, inductors, or IC chips, in which the device combination essentially functions as an energy management system. Next, a lamination process is performed to bind the integrated cathode electrode sheet, the intermediate bonding layer, and the integrated anode electrode sheet together and after the conductive via through holes are aligned with the conductive pad, a metal plug is utilized to penetrate the conductive via through holes and connect the conductive pad for forming a bipolar/membrane electrode assembly (MEA) module. Finally, the bipolar/MEA module is combined with a fuel container base (not shown) to form an integrated packed fuel cell.

According to another embodiment of the present invention, the device combination can be disposed on the intermediate layer, the integrated anode electrode sheet, the fuel container base, or another substrate.

According to another embodiment of the present invention, the resistor, capacitor, inductor, or IC chip of the device combination can be disposed separately on the integrated cathode electrode sheet, the intermediate layer, the integrated anode electrode sheet, the fuel container base, or another substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
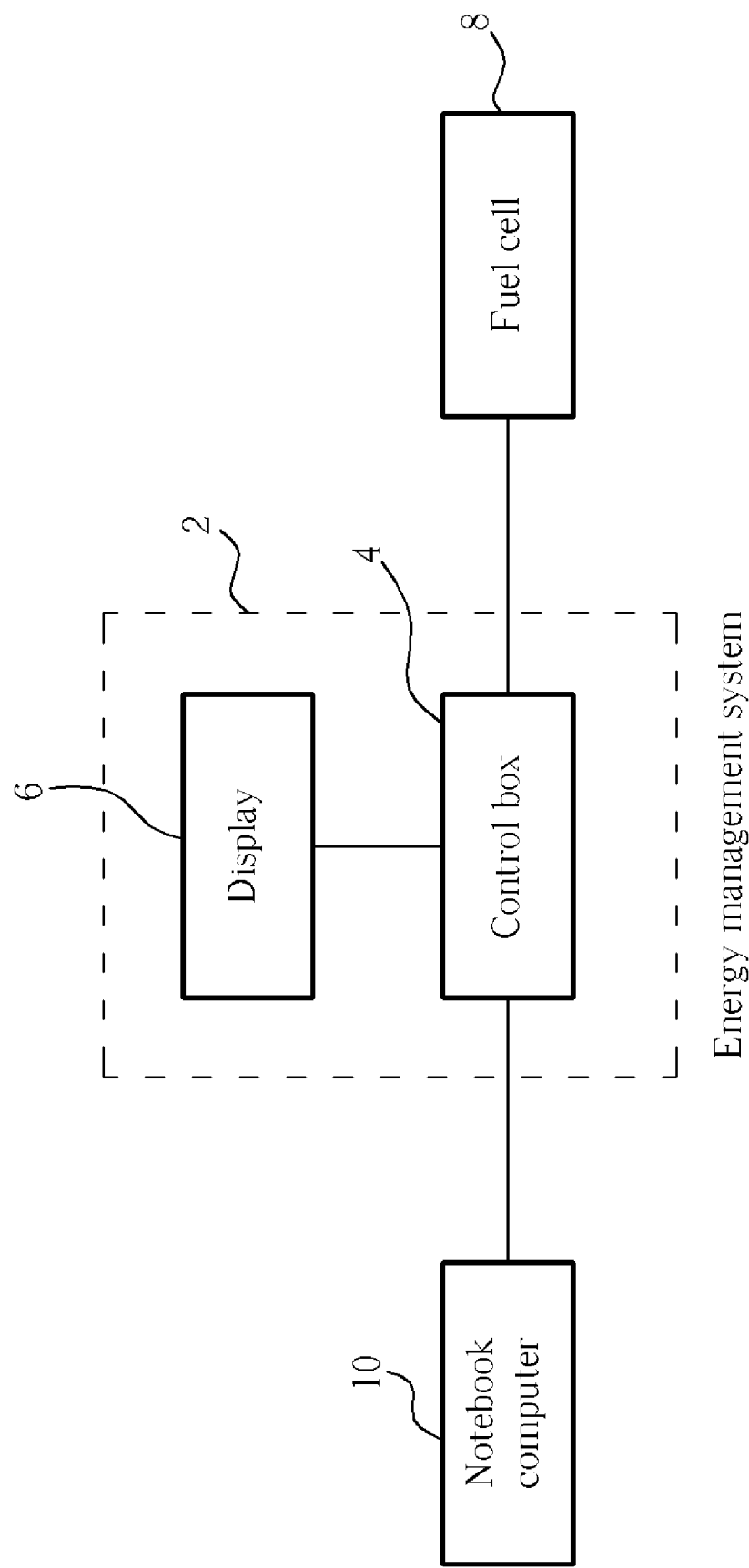
FIG. 1 is a perspective diagram showing the energy management system of a conventional fuel cell.
Figure 2:
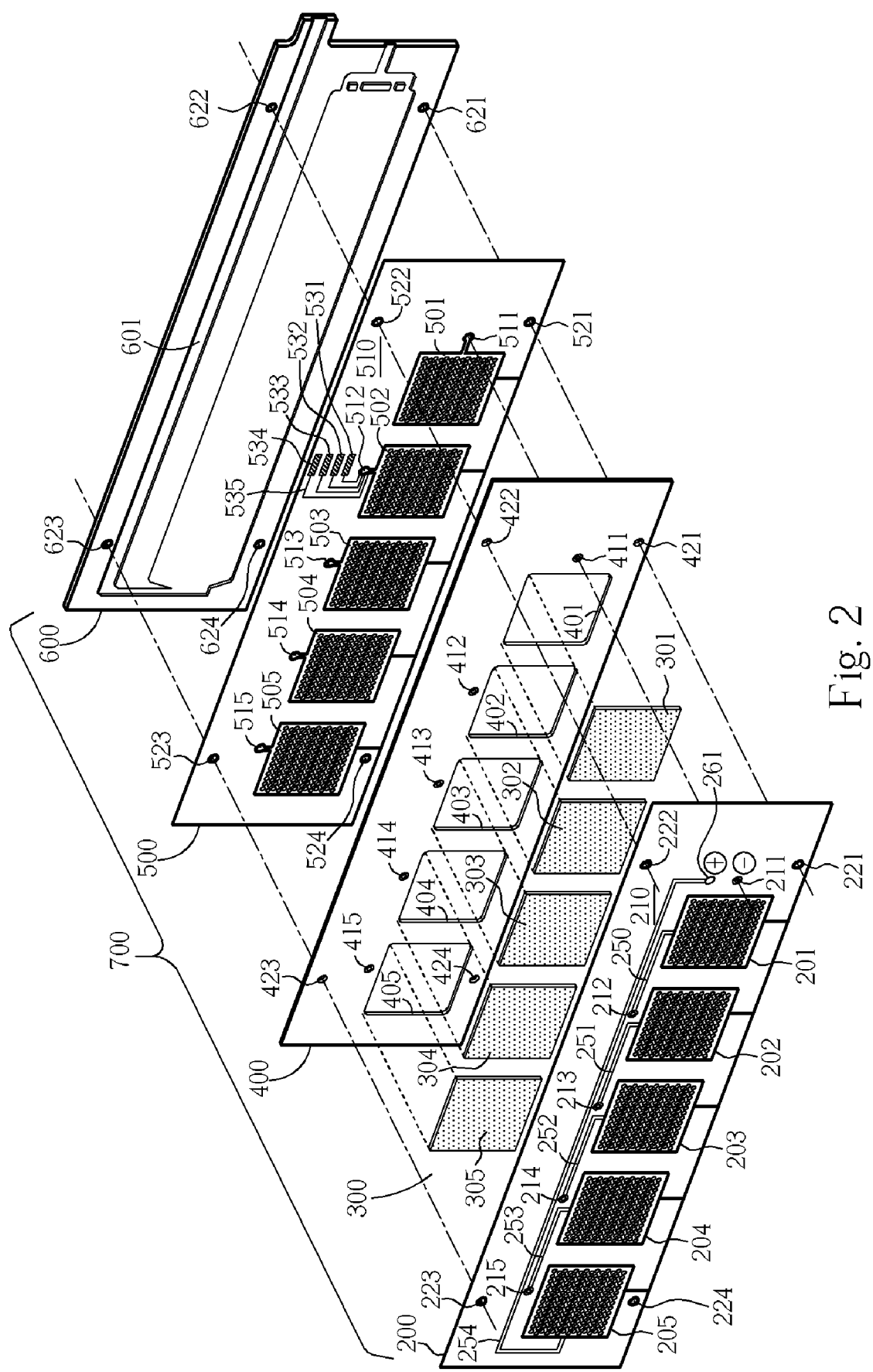
FIG. 2 is a perspective, exploded diagram illustrating an integrated packed fuel cell with five serially connected basic cell units in accordance with one preferred embodiment of the present invention.

Please refer to FIG. 2. FIG. 2 is a perspective, exploded diagram illustrating an integrated packed fuel cell 700 with five serially connected basic cell units in accordance with one preferred embodiment of the present invention. It is to be understood that the integrated packed fuel cell 700 with five serially connected basic cell units is merely an exemplary embodiment. Depending on the requirements of the applied apparatuses, other numbers of basic cell units such as ten or twenty may be utilized. As shown in FIG. 2, the integrated packed fuel cell 700 generally comprises an integrated thin cathode electrode sheet 200, Membrane Electrode Assembly (MEA) unit 300, intermediate bonding layer 400, integrated thin anode electrode sheet 500, and a fuel container 600.

The integrated thin cathode electrode sheet 200 comprises a substrate 210, cathode electrode areas 201, 202, 203, 204, and 205, and conductive via through holes 211, 212, 213, 214, and 215. Preferably, on the surface area of the substrate 210 outside the cathode electrode areas 201, 202, 203, 204, and 205, and the conductive via through hole 211, 212, 213, 214, and 215, a layer of solder resist is coated thereon. At the corners of the substrate 210, mounting through holes 221, 222, 223, and 224 are provided. It is noteworthy that the integrated thin cathode electrode sheet 200 is fabricated by utilizing PCB compatible processes. The substrate 210 may be made of ANSI-grade glass fiber reinforced polymeric materials such as FR-1, FR-2, FR-3, FR-4, FR-5, CEM-1, or CEM-3, but not limited thereto. Each of the cathode electrode areas 201, 202, 203, 204, and 205, on which a plurality of through holes are formed, is defined by a patterned copper foil. The opening ratio of each of the cathode electrode areas 201, 202, 203, 204, and 205, is the ratio of the surface area of the through holes to the area of each of the cathode electrode areas. The opening ratio of each of the cathode electrode areas 201, 202, 203, 204, and 205, is preferably no less than 50%.

The conductive via through hole 212 is electrically connected to the cathode electrode area 201 with the conductive wire 250. The conductive via through hole 213 is electrically connected to the cathode electrode area 202 with the conductive wire 251. The conductive via through hole 214 is electrically connected to the cathode electrode area 203 with the conductive wire 252. The conductive via through hole 215 is electrically connected to the cathode electrode area 204 with the conductive wire 253. The cathode electrode area 205 is electrically connected to a positive (cathode) electrode node 261, which, in operation, is further electrically connected with an external circuit. The conductive via through hole 211, which acts as a negative (anode) electrode node of the DMFC 20, is electrically connected with the external circuit in operation.

The MEA unit 300 comprises a first proton exchange membrane 301, a second proton exchange membrane 302, a third proton exchange membrane 303, a fourth proton exchange membrane 304, and a fifth proton exchange membrane 305, corresponding to the cathode electrode areas 201, 202, 203, 204, and 205. Each of the proton exchange membranes 301, 302, 303, 304, and 305 may utilize commercially available proton conducting polymer electrolyte membranes, for example, NAFION™, but are not limited thereto.

The intermediate bonding layer 400 comprises at least one bonding sheet, which may be made of Prepreg B-stage resin, which is an ordinary material in PCB processes. The Prepreg B-stage resin may be completely cured at about 140° C. for a process time period of about 30 minutes. Corresponding to the proton exchange membranes 301, 302, 303, 304, and 305, five openings 401, 402, 403, 404, and 405 are provided on the intermediate bonding layer 400 for accommodating respective proton exchange membranes. At a side of the opening 401 corresponding to the conductive via through hole 211 of the substrate 210, as specifically indicated in FIG. 3, a conductive via through hole 411 is provided. At a side of respective openings 402, 403, 404, and 405 corresponding to the conductive via through holes 212, 213, 214, and 215, conductive via through holes 412, 413, 414, and 415 are provided. In another case, the intermediate bonding layer 400 may further include a thin supporting layer that is made of glass fiber reinforced polymeric materials such as FR-1, FR-2, FR-3, FR-4, FR-5, CEM-1, or CEM-3. At the corners, corresponding to the mounting through holes 221, 222, 223, and 224 of the substrate 210, there are mounting through holes 421, 422, 423, and 424 provided.

The integrated thin anode electrode sheet 500 comprises a substrate 510, anode electrode areas 501, 502, 503, 504, and 505, conductive pads 511, 512, 513, 514, and 515, and a device combination. Comprised of a capacitor 531, a resistor 532, an inductor 533, and an IC chip 534, the device combination is electrically connected to a conductive wire 535 to form an energy management system of the integrated packed fuel cell. It is noteworthy that the anode electrode areas 501, 502, 503, 504, 505 are defined simultaneously with the conductive pads 511, 512, 513, 514, 515. At the corners of the substrate 510, corresponding to the mounting through holes 221, 222, 223, and 224 of the substrate 210, there are mounting through holes 521, 522, 523, and 524 provided. The integrated thin anode electrode sheet 500 is fabricated by utilizing PCB compatible processes. Likewise, the substrate 510 may be made of ANSI-grade glass fiber reinforced polymeric materials such as FR-1, FR-2, FR-3, FR-4, FR-5, CEM-1, CEM-3, or the like. Each of the anode electrode areas 501, 502, 503, 504, and 505, on which a plurality of through holes are formed, is defined by a patterned copper foil. The opening ratio of each of the anode electrode areas is preferably no less than 50%.

The fuel container 600 has fuel channel 601 and mounting through holes 621, 622, 623, and 624 corresponding to the mounting through holes 221, 222, 223, and 224 of the substrate 210. The fuel container 600 may be made of polymeric materials such as epoxy resin, polyimide, or acrylic. The fuel channel 601 may be fabricated by utilizing conventional mechanical grinding methods or plastic extrusion methods.

When assembling, the proton exchange membranes 301, 302, 303, 304, and 305 are installed within the respective openings 401, 402, 403, 404, and 405 of the intermediate bonding layer 400. The intermediate bonding layer 400, together with the installed proton exchange membranes 301, 302, 303, 304, and 305, is then sandwiched by the integrated thin cathode electrode sheet 200 and the integrated thin anode electrode sheet 500. The resultant laminate stack having, in order, the integrated thin cathode electrode sheet 200, the intermediate bonding layer 400 (and installed proton exchange membranes), and the integrated thin anode electrode sheet 500 is then mounted on the fuel container 600.

The conductive via through holes 211, 212, 213, 214 and 215 of the integrated thin cathode electrode sheet 200 are aligned, and in contact, with the respective conductive via through holes 411, 412, 413, 414, and 415 of the intermediate bonding layer 400, which are aligned with the conductive pads 511, 512, 513, 514, and 515 of the integrated thin anode electrode sheet 500. Conventional soldering process may be utilized to electrically connect and fix the aligned conductive through holes such as conductive via through holes 211, 411, and conductive pad 511, and so on. By doing this, the cathode electrode area 201 of the integrated thin cathode electrode sheet 200 is electrically connected to the anode electrode area 502 of the integrated thin anode electrode sheet 500 through the conductive path constituted by the conductive wire 250, the soldered conductive via through holes 212 and 412, and the conductive pad 512 of the integrated thin anode electrode sheet 500. The cathode electrode area 202 of the integrated thin cathode electrode sheet 200 is electrically connected to the anode electrode area 503 of the integrated thin anode electrode sheet 500 through the conductive path constituted by the conductive wire 251, the soldered conductive via through holes 213 and 413, and the conductive pad 513 of the integrated thin anode electrode sheet 500, and so on. The conductive via through hole 211 of the integrated thin cathode electrode sheet 200, which acts as the negative electrode of the DMFC 20, is electrically connected to the anode electrode area 501 of the integrated thin anode electrode sheet 500 through the conductive via through hole 411 of the intermediate bonding layer 400.

Please refer to FIG. 3 through FIG. 7. FIG. 3 through FIG. 7 are perspective diagrams showing the method of fabricating an integrated packed fuel cell 700 according to the first embodiment of the present invention.

Figure 3:
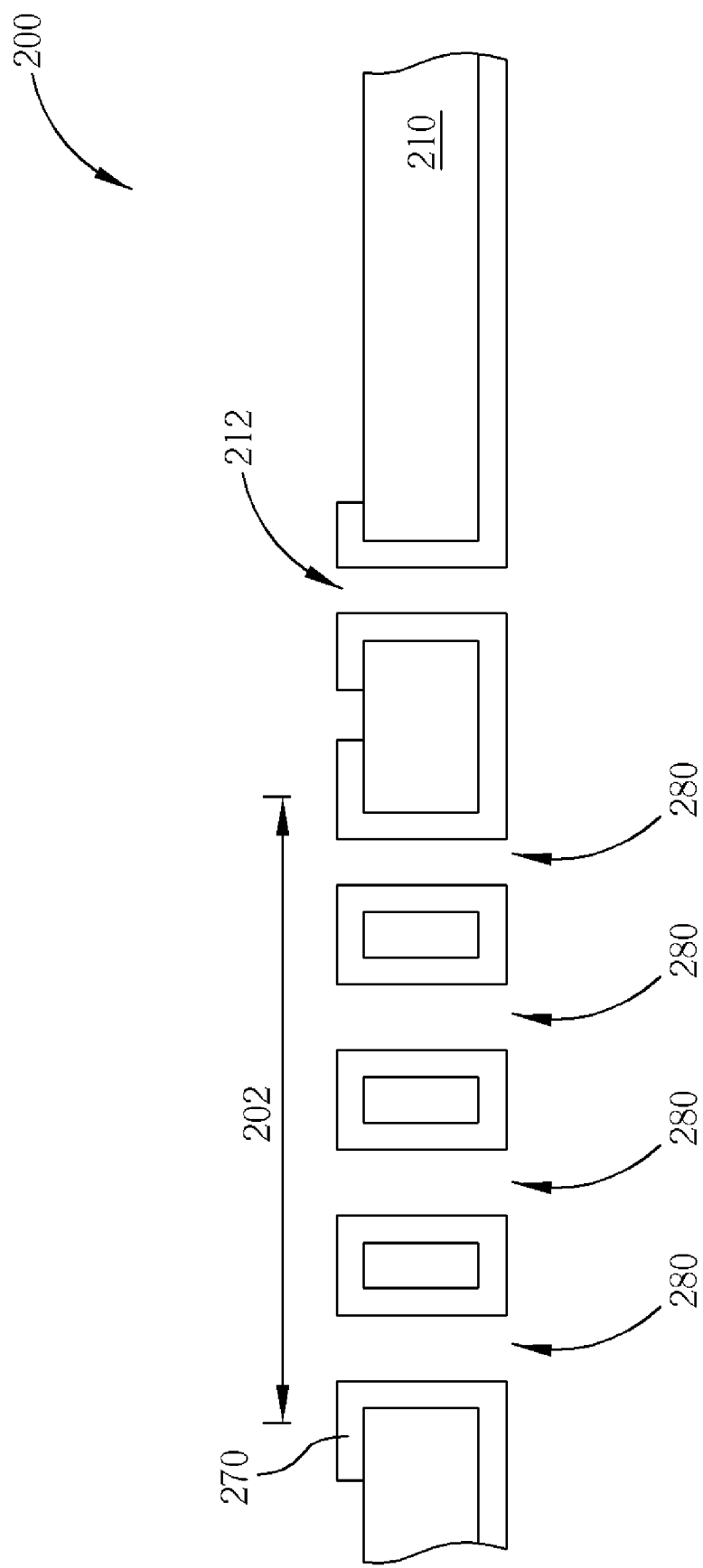
FIG. 3 through FIG. 7 are perspective diagrams showing the method of fabricating an integrated packed fuel cell according to the first embodiment of the present invention.

As shown in FIG. 3, the integrated cathode electrode sheet 200 includes a substrate 210, a patterned copper layer 270 forming at least a cathode electrode area 202 on both sides of the substrate 210, and at least a conductive via through hole 212, in which a plurality of openings 280 are formed within the cathode electrode area 202. According to the preferred embodiment of the present invention, the total area of the openings 280 is greater than 50% of each electrode area (i.e., the opening ratio).

Figure 4:
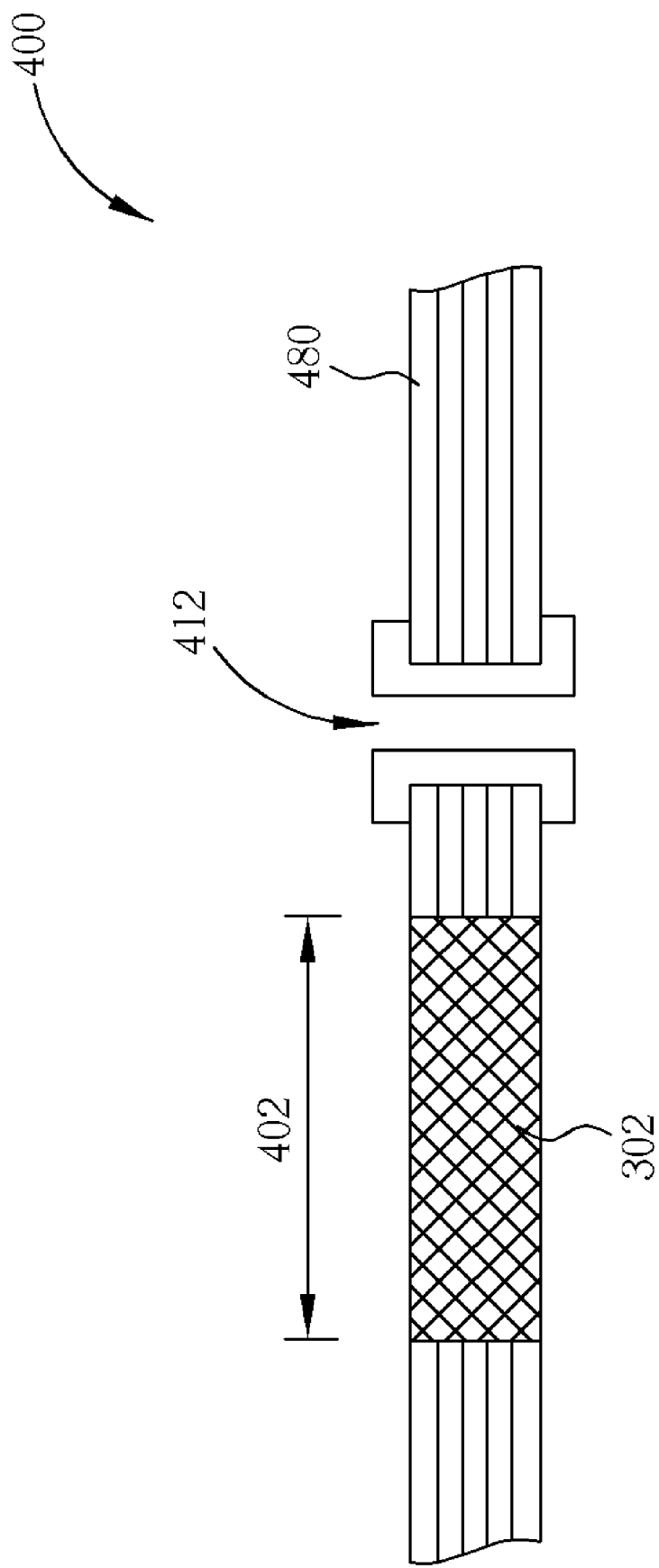

As shown in FIG. 4, the intermediate bonding layer 400 is comprised of at least one bonding sheet 480. Additionally, the intermediate bonding layer further comprises at least one opening 412 within each bonding sheet 480 for containing the proton exchange membrane 302. The thickness of the proton exchange membrane 302 is usually the principal factor for determining the number of bonding sheet 480. The intermediate bonding layer 400 further includes at least a conductive via through hole 412, in which the conductive via through hole 412 is disposed and corresponds to the conductive via through hole 212.

Figure 5:
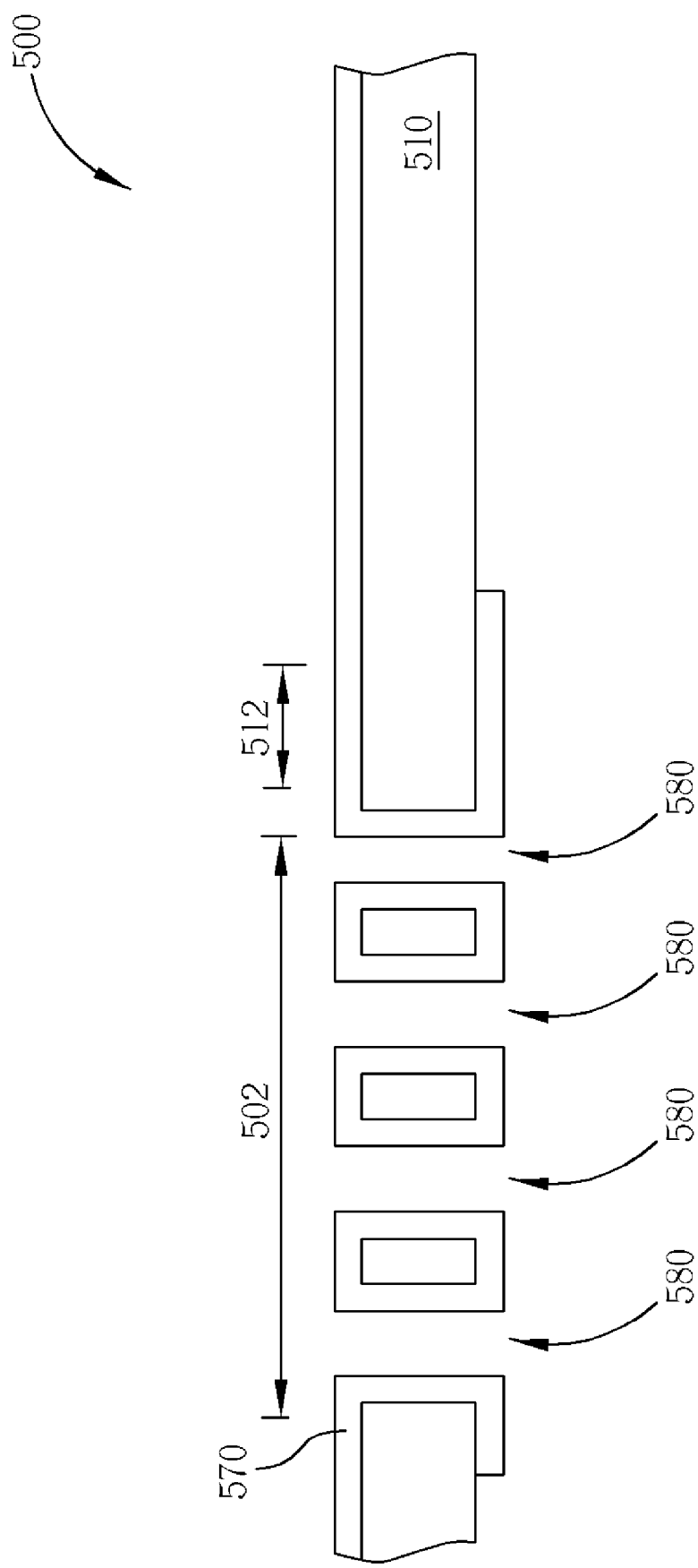

As shown in FIG. 5, an integrated anode electrode sheet 500 includes a substrate 510, a patterned copper layer 570 forming at least an anode electrode area 502 on both sides of the substrate 510, in which the anode electrode area 502 is located and corresponds to the cathode electrode area 202, and at least a conductive pad 512, in which the conductive pad 512 is disposed and corresponds to the conductive via through hole 212. According to the preferred embodiment of the present invention, a plurality of openings 580 are formed within the anode electrode area 502 and the total area of the openings 580 is greater than 50% of each electrode area.

Figure 6:
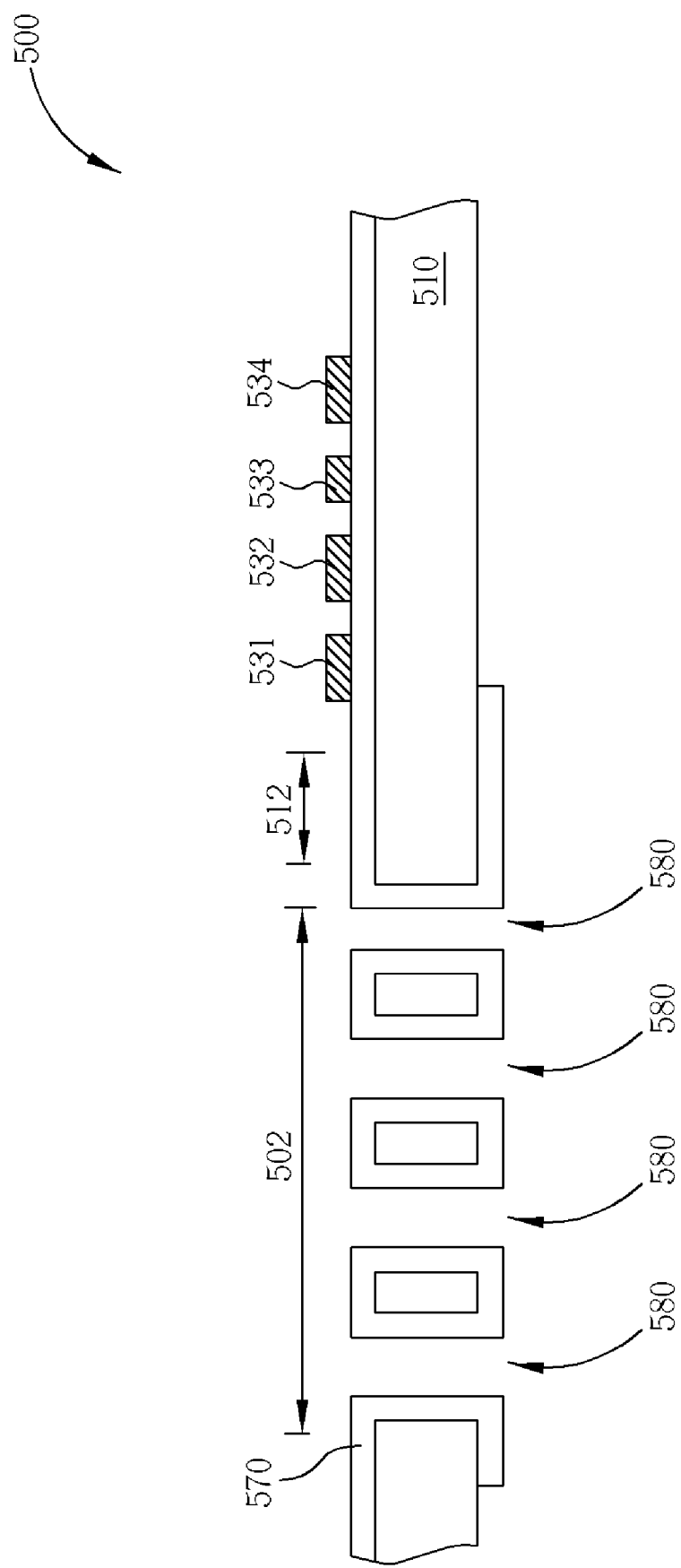

As shown in FIG. 6, a device combination is embedded over the surface of the integrated anode electrode sheet 500. Preferably, the device combination is comprised of electronic devices such as capacitors, resistors, inductors, or IC chips. According to the present embodiment, the device combination is comprised of a capacitor 531, a resistor 532, an inductor 533, and an IC chip 534. Functioning as an energy management system, the device combination is able to monitor and distribute the content, concentration, volume of electric current and electric voltage within the fuel cell.

Figure 7:
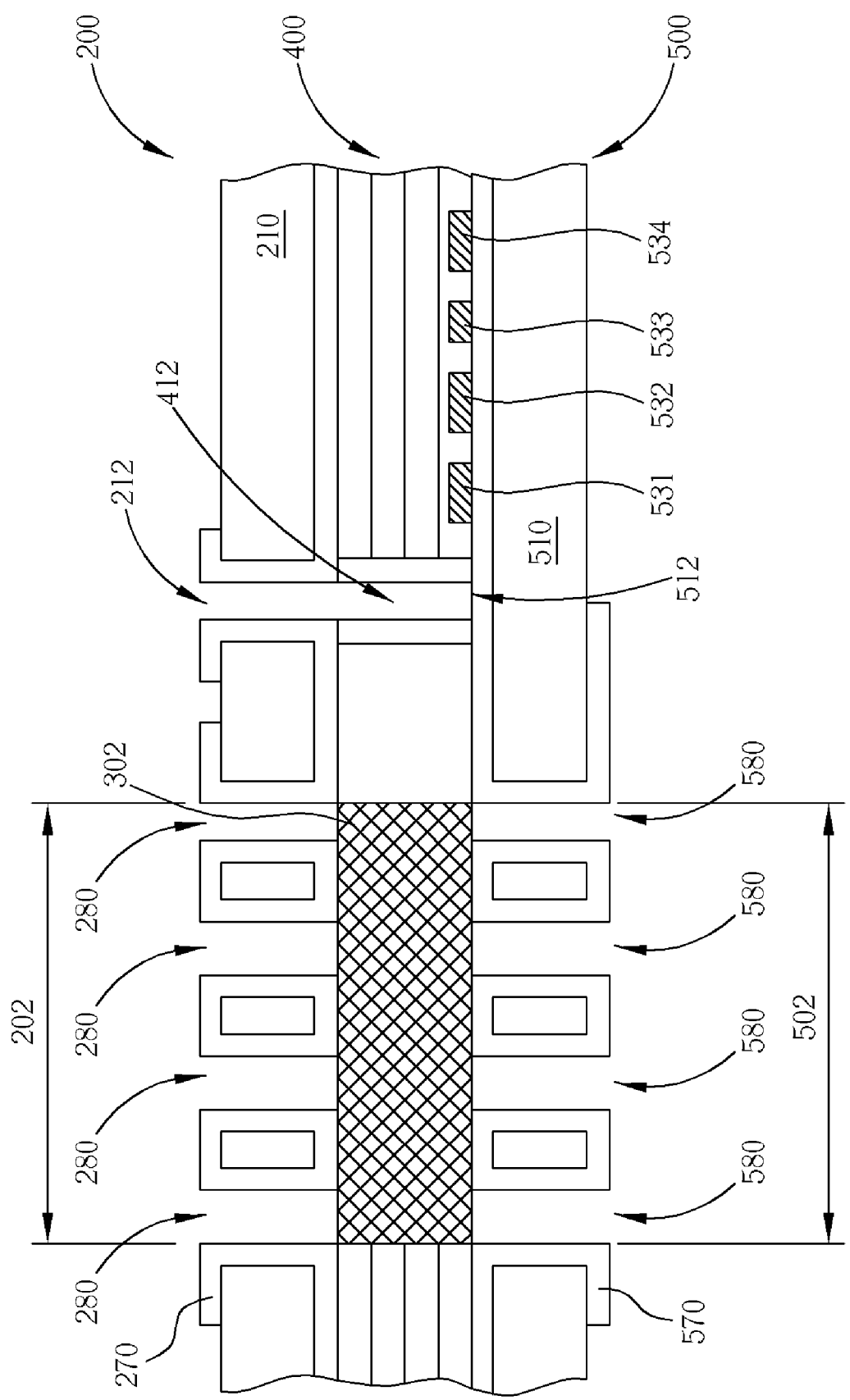

As shown in FIG. 7, a lamination process is performed to bind the integrated cathode electrode sheet 200, the intermediate bonding layer 400, and the integrated anode electrode sheet 500 together. Next, the conductive via through holes 212 and 412 are aligned with the conductive pad 512 and a metal plug (not shown) is utilized to penetrate the conductive via through holes 212 and 412 and connect the conductive pad 512 for forming a bipolar/membrane electrode assembly (MEA) module. Finally, the bipolar/MEA module is combined with a fuel container base (not shown) to form an integrated packed fuel cell.

Preferably, the device combination can also be disposed over the surface of the integrated anode electrode sheet, intermediate bonding layer, fuel container base, or another substrate.

Please refer to FIG. 8 through FIG. 13. FIG. 8 through FIG. 13 are perspective diagrams showing the method of fabricating an integrated packed fuel cell according to the second embodiment of the present invention. In contrast to the first embodiment of embedding all electronic devices of the device combination over the surface of the same substrate, such as the surface of the integrated cathode electrode sheet, the integrated anode electrode sheet, the intermediate bonding layer, or the fuel container base, the electronic devices, including capacitors, resistors, inductors, or IC chips of the second embodiment can be disposed separately on the integrated cathode electrode sheet, integrated anode electrode sheet, intermediate bonding layer, fuel container base, or another substrate, thereby reducing the total area occupied by the electronic devices and increasing the layout efficiency of the substrate surface.

Figure 8:
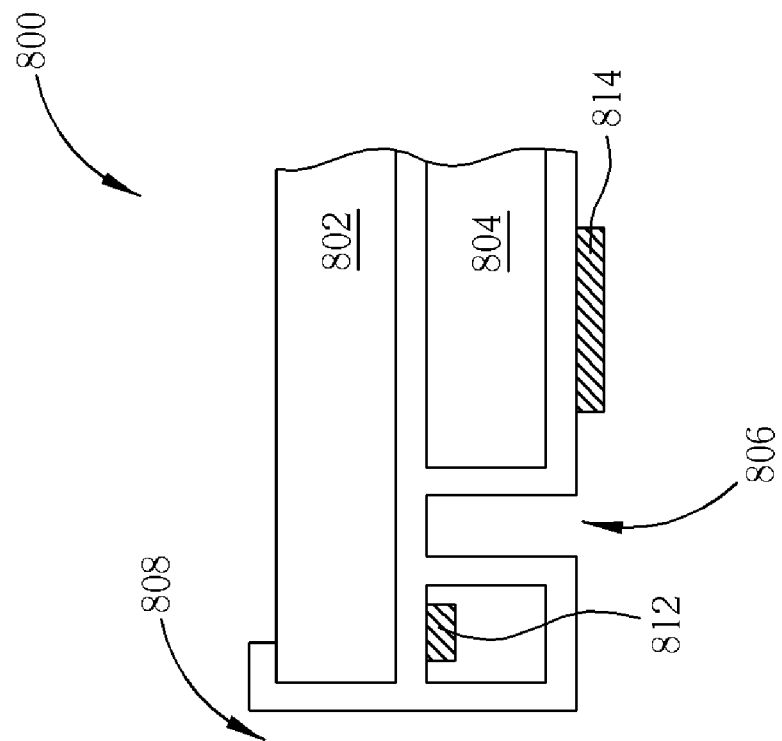
FIG. 8 through FIG. 13 are perspective diagrams showing the method of fabricating an integrated packed fuel cell according to the second embodiment of the present invention.

As shown in FIG. 8, an integrated cathode electrode sheet 800 includes two substrates 802 and 804, at least a blind via 806, a conductive via through hole 808, a capacitor 812 of the device combination, and an IC chip 814, in which each of the substrate 802 and 804 is comprised of at least one patterned copper layer. According to the present embodiment, the substrate 802 is comprised of patterned copper layers on both sides of the substrate whereas the substrate 804 is comprised of a patterned copper layer on only one side of the substrate. The integrated cathode electrode sheet 800 is formed by laminating the surface of the substrate 804 without the copper layer with the substrate 802, in which the blind via 806 is formed within the substrate 804, the conductive via through hole 808 is formed within the substrate 802 and 804, and the capacitor 812 of the device combination and the IC chip 814 are formed separately on the surface of the substrate 802 and 804.

Figure 9:
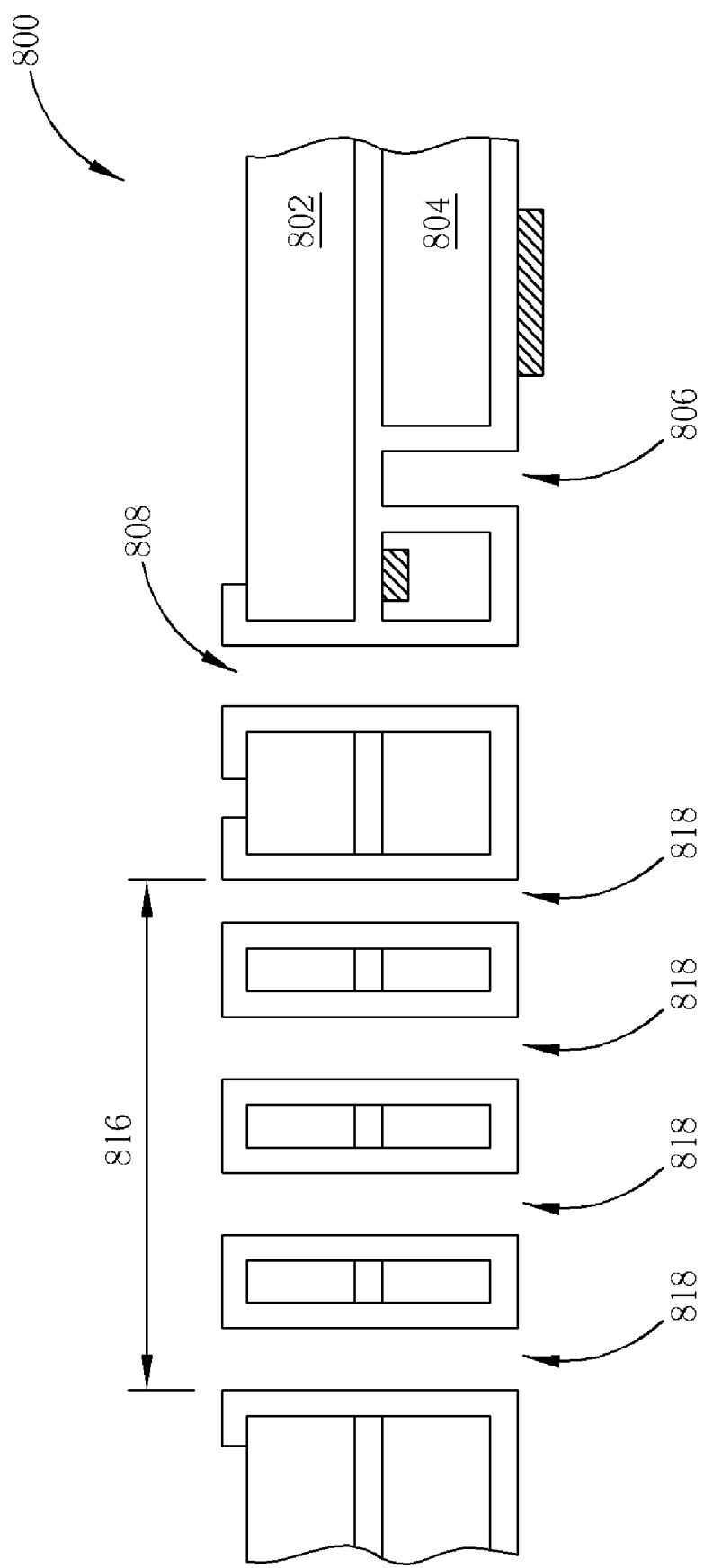

As shown in FIG. 9, at least a cathode electrode area 816 is formed within the integrated cathode electrode sheet 800. According to the preferred embodiment of the present invention, a plurality of openings 818 are formed within the cathode electrode area 816 and the total area of the openings 818 is greater than 50% of each electrode area.

Figure 10:
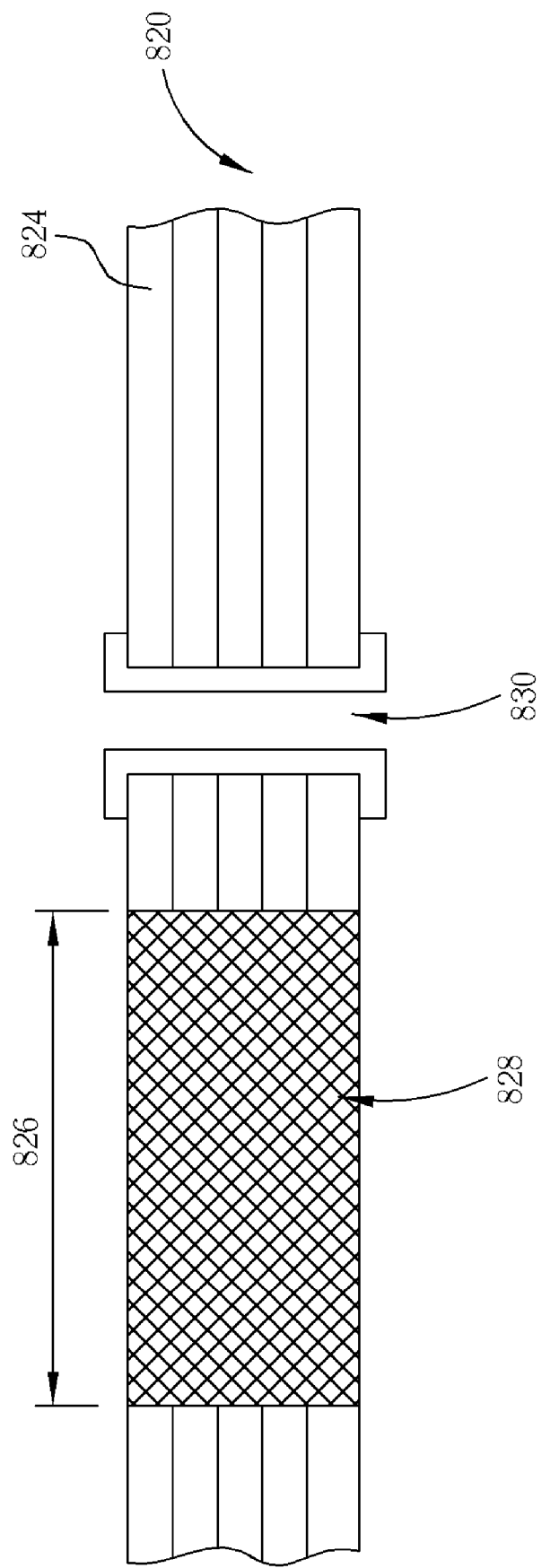

As shown in FIG. 10, an intermediate bonding layer 820 is comprised of at least a bonding sheet 824. Each bonding sheet 824 includes at least an opening 826 for containing an MEA 828. Additionally, the intermediate bonding layer 820 includes at least a conductive via through hole 830, in which the conductive via through hole 830 is disposed and corresponds to the conductive via through hole 808.

Figure 11:
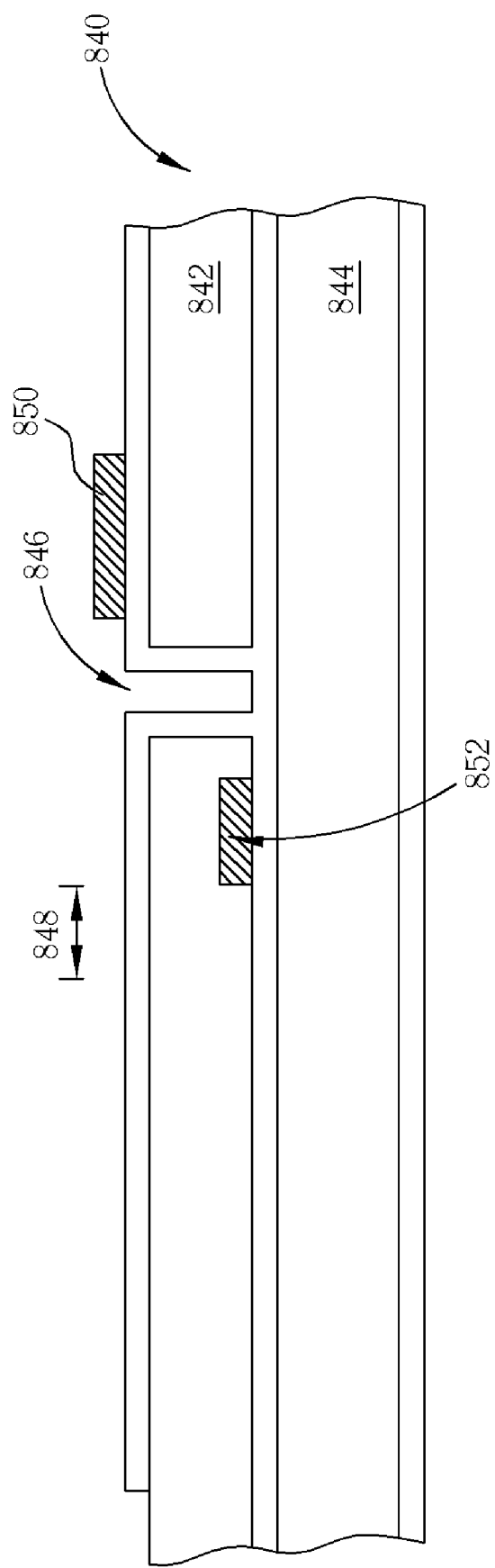

As shown in FIG. 11, an integrated anode electrode sheet 840 includes two substrates 842 and 844, at least an opening 846, a conductive pad 848, and an inductor 850 and resistor 852 of the device combination, in which each of the substrate 842 and 844 is comprised of at least one patterned copper layer. According to the present embodiment, the substrate 842 is comprised of patterned copper layers on both sides of the substrate whereas the substrate 844 is comprised of a patterned copper layer on only one side of the substrate. Preferably, the integrated anode electrode sheet 840 is formed by laminating the side of the substrate 842 without the copper layer with the substrate 844, in which the opening 846 is formed within the substrate 842, the conductive pad 848 is formed over the surface of the substrate 842, and the inductor 850 and resistor 852 of the device combination are formed separately on the surface of the substrate 842 and 844.

Figure 12:
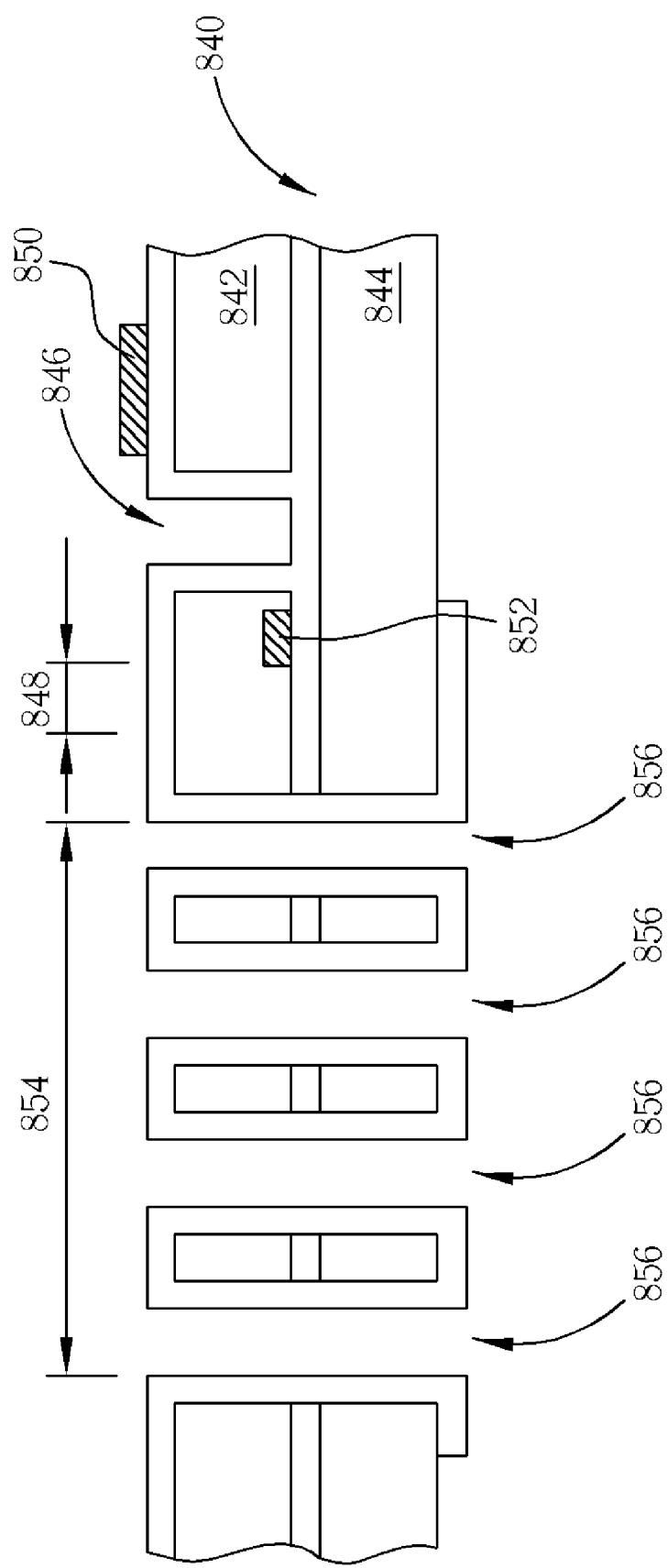

As shown in FIG. 12, at least an anode electrode area 854 is formed within the integrated anode electrode sheet 840. According to the preferred embodiment of the present invention, a plurality of openings 856 are formed within the anode electrode area 854 and the total area of the openings 856 is greater than 50% of each electrode area.

Figure 13:
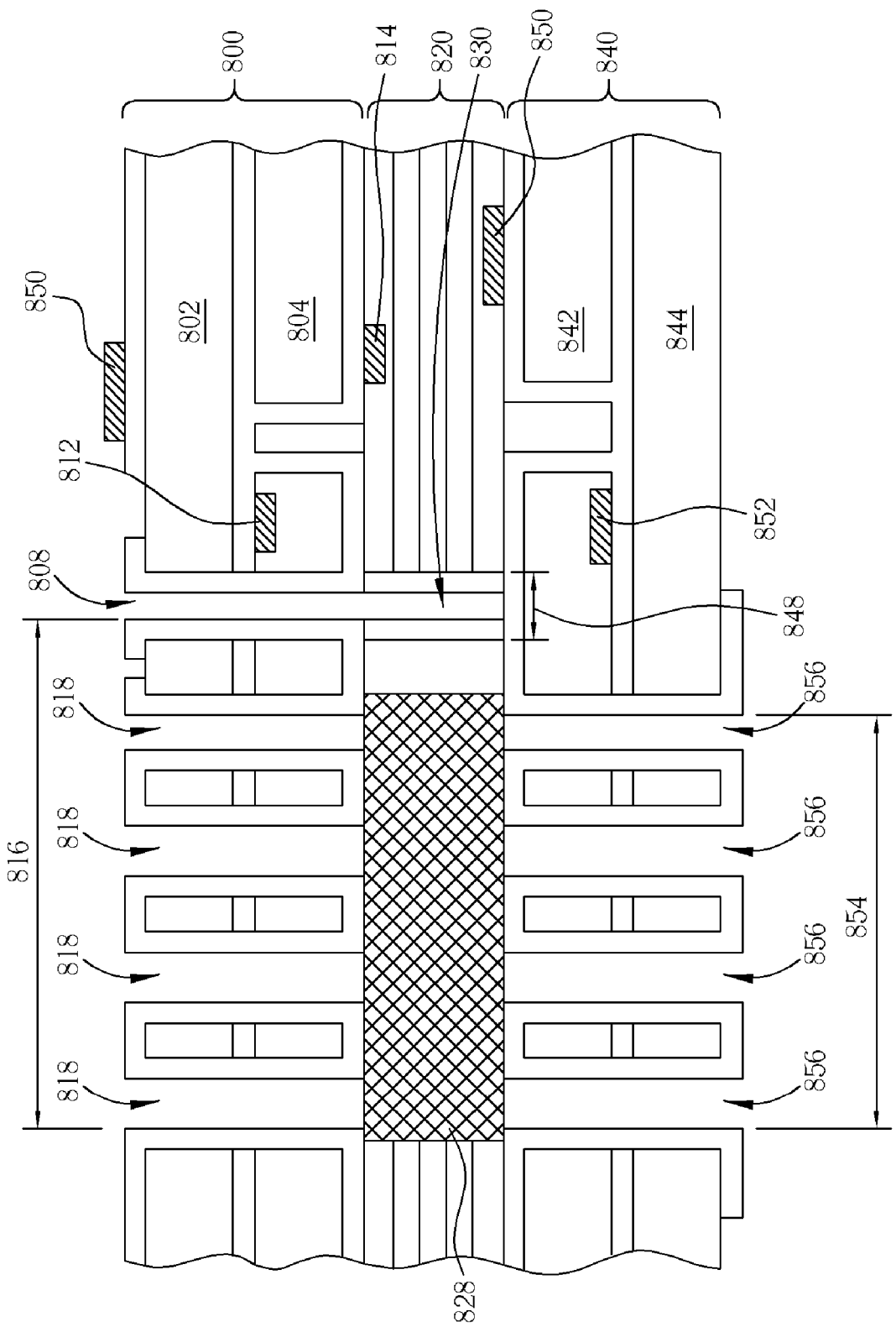

As shown in FIG. 13, a laminating process is performed to bind the integrated cathode electrode sheet 800, the intermediate bonding layer 820, and the integrated anode electrode sheet 840 together and to align the conductive via through holes 808 and 830 and the conductive pad 848 in position. Next, a metal plug (not shown) is utilized to penetrate the conductive via through holes 808 and 830 and connect the conductive pad 848 for forming a bipolar/MEA module. Finally, the bipolar/MEA module is combined with a fuel container base (not shown) to form the integrated packed fuel cell.

Overall, the integrated packed fuel cell according to the present invention includes the following advantages:

(a) By eliminating an energy control box, the fuel cell is much more convenient to be carried and to be utilized in mobile electronic products.

(b) The major components of the fuel cell including the integrated cathode electrode sheet, the integrated anode electrode sheet, and the device combination are all fabricated by standard printed circuit board techniques thereby reducing the total cost of fabricating an integrated packed fuel cell.

(c) The device combination can be embedded separately onto the surface of different substrates thereby reducing the total area occupied by the electronic devices and increasing the layout efficiency of the substrate surface.

(d) The utilization of the mature printed circuit board fabrication technique maximizes the production of the integrated packed fuel cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated packed fuel cell comprising:
    an integrated cathode electrode sheet;
    a plurality of proton exchange membranes;
    an intermediate bonding layer comprises a plurality of bonding sheets and a plurality of openings for containing the proton exchange membranes;
    an integrated anode electrode sheet;
    a fuel container base; and
    a device combination.

2. The integrated packed fuel cell of claim 1, wherein the integrated cathode electrode sheet further comprising:
    a first substrate;
    a plurality of cathode electrode areas; and
    a plurality of first conductive via through holes.

3. The integrated packed fuel cell of claim 2, wherein each of the cathode electrode areas is a copper layer formed on both sides of the first substrate, wherein the first substrate comprises a plurality of holes therein, and the first conductive via through hole is located outside each of the cathode electrode areas and connected to each of the cathode electrode areas via a conductive wire.

4. The integrated packed fuel cell of claim 2, wherein each of the proton exchange membranes is placed and corresponds to each of the cathode electrode areas.

5. The integrated packed fuel cell of claim 2, wherein the intermediate bonding layer further comprises a plurality of second conductive via through holes, wherein the second conductive via through holes are located corresponding to the first conductive via through holes.

6. The integrated packed fuel cell of claim 2, wherein the integrated anode electrode sheet further comprising:
    a second substrate;
    a plurality of anode electrode areas correspond to the cathode electrode areas; and
    a plurality conductive pads correspond to the first conductive via through holes.

7. The integrated packed fuel cell of claim 6, wherein the integrated cathode electrode sheet, the proton exchange membranes, the intermediate bonding layer, and the integrated anode electrode sheet are laminated and soldered accordingly, wherein each of the first conductive via through holes of the integrated cathode electrode sheet is aligned with each of the second conductive via through holes of the intermediate bonding layer and each of the conductive pads of the integrated anode electrode sheet.

8. The integrated packed fuel cell of claim 1, wherein the device combination is comprised of a capacitor, a resistor, an inductor, or a semiconductor chip.

9. The integrated packed fuel cell of claim 1, wherein the device combination is utilized as an energy management system for the fuel cell.

10. The integrated packed fuel cell of claim 1, wherein the device combination is embedded on the surface of the integrated cathode electrode sheet.

11. The integrated packed fuel cell of claim 1, wherein the device combination is embedded on the surface of the intermediate bonding layer.

12. The integrated packed fuel cell of claim 1, wherein the device combination is embedded on the surface of the integrated anode electrode sheet.

13. The integrated packed fuel cell of claim 1, wherein the device combination is embedded on the surface of the fuel container base.

14. The integrated packed fuel cell of claim 1, wherein at least one of the bonding sheets is a made of a prepreg B-stage resin.

* * * * *